United States Patent
Scholz

(10) Patent No.: US 7,278,438 B2
(45) Date of Patent: Oct. 9, 2007

(54) APPARATUS AND PROCESS FOR REFILLING A BUBBLER

(75) Inventor: Christoph Scholz, Waakirchen (DE)

(73) Assignee: CS Clean Systems AG, Ismaning (DE)

( * ) Notice: Subject to any disclaimer, the term of this patent is extended or adjusted under 35 U.S.C. 154(b) by 256 days.

(21) Appl. No.: 11/061,344

(22) Filed: Feb. 18, 2005

(65) Prior Publication Data

US 2005/0183771 A1  Aug. 25, 2005

(30) Foreign Application Priority Data

Feb. 20, 2004  (EP) ................................. 04003928

(51) Int. Cl.
F17D 1/16 (2006.01)
(52) U.S. Cl. .......................... 137/14; 137/209; 261/53
(58) Field of Classification Search ................ 137/208, 137/209, 409–433, 1–15.26; 261/121.1, 261/53, 64.1, 65, DIG. 65
See application file for complete search history.

(56) References Cited

U.S. PATENT DOCUMENTS

| | | | | |
|---|---|---|---|---|
| 4,235,829 A | * | 11/1980 | Partus | 137/209 |
| 4,436,674 A | * | 3/1984 | McMenamin | 261/130 |
| 4,545,801 A | * | 10/1985 | Miyajiri et al. | 137/209 |
| 4,582,480 A | * | 4/1986 | Lynch et al. | 261/121.1 |
| 4,676,404 A | * | 6/1987 | Yamazaki et al. | 137/208 |
| 4,859,375 A | * | 8/1989 | Lipisko et al. | 137/209 |
| 4,979,545 A | * | 12/1990 | Fair | 137/386 |
| 5,035,200 A | * | 7/1991 | Moriyama et al. | 261/121.1 |
| 5,279,338 A | * | 1/1994 | Goossens | 141/95 |
| 5,972,117 A | * | 10/1999 | Schmitt | 261/121.1 |
| 6,161,398 A | * | 12/2000 | Partus | 65/379 |
| 6,311,959 B1 | * | 11/2001 | Nguyen et al. | 261/121.1 |
| 6,435,224 B2 | * | 8/2002 | Blatt et al. | 137/209 |
| 6,581,625 B1 | * | 6/2003 | Arai et al. | 137/341 |
| 6,588,458 B2 | * | 7/2003 | Rodgers | 141/100 |
| 6,615,851 B2 | * | 9/2003 | Scholz | 134/104.1 |

FOREIGN PATENT DOCUMENTS

| | | |
|---|---|---|
| EP | 0 147 663 A1 | 7/1985 |
| JP | 63-8232 | 1/1988 |
| WO | WO86/01232 | 2/1986 |
| WO | WO92/05406 | 4/1992 |

\* cited by examiner

*Primary Examiner*—Eric Keasel
*Assistant Examiner*—Craig Price
(74) *Attorney, Agent, or Firm*—Flynn, Thiel, Boutell & Tanis, P.C.

(57) ABSTRACT

In order to evaporate a liquid substance (3) and convey it to a user, a bubbler (1) is provided, into which a carrier gas (7) is conveyed. When a minimum level (4) has been reached, an exact quantity of the substance (3) is refilled from a reservoir tank (15). For this purpose, an intermediate tank (25) is provided, which is filled with an inert gas up to a pressure P1. An inert gas (21) is applied to the reservoir tank (15) at a pressure P2, higher than P1. The intermediate tank (25) is connected with the reservoir tank (15), as a result of which a specific quantity of the substance (3) flows into the intermediate tank (25) and is conveyed via a connection line (17) to the bubbler (1), with inert gas (32) first having been applied to the connection line (17) at a pressure P3, lower than P2.

3 Claims, 2 Drawing Sheets

APPARATUS AND PROCESS FOR REFILLING A BUBBLER

FIELD OF THE INVENTION

The invention relates to an apparatus and process for refilling a bubbler used to convey a carrier gas into a liquid substance in order to evaporate the substance and supply it to a user, according to the generic part of claims 1 and 9.

BACKGROUND OF THE INVENTION

Such an apparatus and process is already known. The user may be, for example, a reactor for chemical vapor deposition (CVD). Such CVD reactors are used in the manufacture of integrated microcircuits and similar electronic components. To meet the increasingly rigorous requirements for such components, substances of very high purity must be used for the chemical vapor deposition process. The substances involved are usually organic metallic and semi-metallic compounds in liquid form.

In addition to the requirement for very high purity, it is also important to ensure precise compliance with the specified gas mixture composition in the CVD reactor, and therefore a consistent quantity of the substance conveyed to the CVD reactor. In order to prevent changes in the composition due to condensation of the evaporated substance in the line to the CVD reactor, it is necessary to place the bubbler as close as possible to the reactor. The bubbler therefore has to have a small volume, which means that it has to be refilled frequently. For this purpose, in the known apparatus the liquid substance is forced out of the reservoir tank into the bubbler with an inert gas.

The quantity of the substance conveyed to the CVD reactor depends on the distance traversed by the carrier gas bubbles in the liquid substance as they rise through the liquid substance. Because of the evaporation of the liquid substance in the bubbler, this distance becomes progressively shorter, and the quantity of evaporated substance in the carrier gas progressively diminishes. In the known apparatus, the resulting variations in concentration are kept as low as possible by providing level sensors for the minimum level and maximum level, respectively.

Level sensors are, however, inherently relatively imprecise, and are not particularly reliable. The use of two level sensors is therefore associated with significant problems. In addition, the liquid substances used are often pyrophorous, and accordingly a discharge of such a substance from the bubbler due to a malfunction of the level sensor for the maximum level would represent a major hazard.

SUMMARY OF THE INVENTION

The objective of the invention is to provide a simple refilling system enabling operation precisely and reliably in accordance with the minimum and maximum levels in the bubbler.

This is achieved according to the invention with the apparatus described in the claims. The claims provide advantageous embodiments of the apparatus according to the invention.

The claims also describes a preferred process for the refilling of the bubbler according to the invention.

According to the invention, a precisely defined quantity of the liquid substance is conveyed to the bubbler during the refilling operation. This precise definition is governed solely by pressure measurement. Since there are commercially available pressure sensors accurate to within the per mil range, the level in the bubbler can be precisely set according to the invention.

The carrier gas used for the evaporation of the liquid substance in the bubbler is an inert gas, for example a noble gas such as argon. The inert gas conveyed to the reservoir tank, intermediate tank, and connection line between the reservoir tank and bubbler via the inert gas line connected thereto can also be a noble gas such as argon.

The level sensor used according to the invention to detect the minimum level can, for example, be a heat sensor, a float, or an ultrasonic or radar sensor, or similar.

Connected to the bubbler are the connection line and the supply line to the user. An immersion tube forming part of the carrier gas line is immersed in the liquid substance in the bubbler, to take up the evaporated liquid substance with the carrier gas bubbles rising through the liquid substance.

In order to provide a stable flow of the carrier gas with the evaporated substance to the user from the beginning of the process, a gas discharge line with a valve is also provided on the supply line, through which the carrier gas with the evaporated substance is first conveyed before the supply line to the user is opened.

Whereas the intermediate tank is preferably located close to the central reservoir tank, the bubbler is generally located close to the user, with the reservoir tank and intermediate tank usually being placed lower than the bubbler and the user. In a building, the connection line can be in the form of a riser, often several meters long, from the reservoir tank and intermediate tank to the bubbler.

Where several bubblers are to be filled using a central reservoir tank via the intermediate tank, the section of the connection line from the immersion tube in the reservoir tank to the inert gas line forms the main section of the connection line, from which individual lines in the form of risers lead to the respective bubblers. Between the inert gas line and each of the bubblers, there is then a valve in each individual line. The pressure regulator in the inert gas line can then be used to set pressures individually in the risers to the bubblers, which may, for example, be located on different floors.

In the apparatus according to the invention, when the minimum level has been detected by the minimum level sensor, the level sensor actuates the control device, which then performs the following steps by actuation of the appropriate valves:

(1) The valve in the carrier gas line and the valve in the supply line are closed, and the bubbler is evacuated, e.g. via the gas discharge line or inert gas line connected to the connection line, to the vapor pressure of the liquid substance 3. In the empty intermediate tank, a predefined pressure (P1) is set via the inert gas line connected to the tank.

(2) A predefined pressure (P2) is set in the reservoir tank via the inert gas line connected to the reservoir tank, that pressure being greater than the pressure (P1) set in step (1) in the intermediate tank.

(3) The reservoir tank is connected with the intermediate tank in order to fill a quantity of liquid substance into the intermediate tank corresponding to the pressure difference ($\Delta P$) between the pressure (P2) in the reservoir tank and the pressure (P1) in the intermediate tank×the volume of the intermediate tank according to Boyle/Mariott's law, P×V=const.

(4) The connection between the reservoir tank and the intermediate tank is severed. This means there is now a precisely defined quantity of the liquid substance in the intermediate tank.

(5) Via the inert gas line connected to the connection line, a pressure (P3) is set in the section of the connection line between the junction line of the intermediate tank and the bubbler, and in the bubbler, that pressure being lower than the pressure reached in the intermediate tank in step (3).

(6) The intermediate tank and the bubbler are connected with one another in order to fill a quantity of the liquid substance into the bubbler corresponding to the pressure difference between the pressure (P2) in the intermediate tank and the pressure (P3) in the bubbler and the section of the connection line between the inert gas line and the bubbler minus the hydrostatic pressure from the difference in height between the intermediate tank and the bubbler. This means that the precisely predefined quantity in the intermediate tank has been transferred from the intermediate tank to the bubbler.

In order to empty the connection line, it is advantageous if the following steps are then also carried out:

(7) The reservoir tank is evacuated, and
(8) The liquid substance in the connection line is sucked back into the evacuated reservoir tank.

Following the filling of the bubbler, carrier gas is conveyed into the liquid substance in the bubbler, such that the carrier with the evaporated liquid substance contained therein is first discharged via the gas discharge line until such time as a stable flow of the carrier gas with the evaporated substance has been reached, at which time the supply line to the user is opened.

The set-up according to the invention has the effect of significantly increasing safety. For example, the level sensor for the maximum level is replaced by pressure controllers or sensors, which are significantly more reliable and precise and also less expensive. Whereas level sensors are single-point-of-failure devices, according to the invention redundancy is provided, since in each of steps 1 to 6 there are two pressure sensors involved. In addition, the connection line is filled only for the duration of the refilling of the bubbler, and is otherwise product-free, i.e. for the majority of the time.

BRIEF DESCRIPTION OF THE DRAWINGS

The invention is now explained in more detail on the basis of examples, with reference to the drawing.

DETAILED DESCRIPTION OF THE INVENTION

Figure 1:
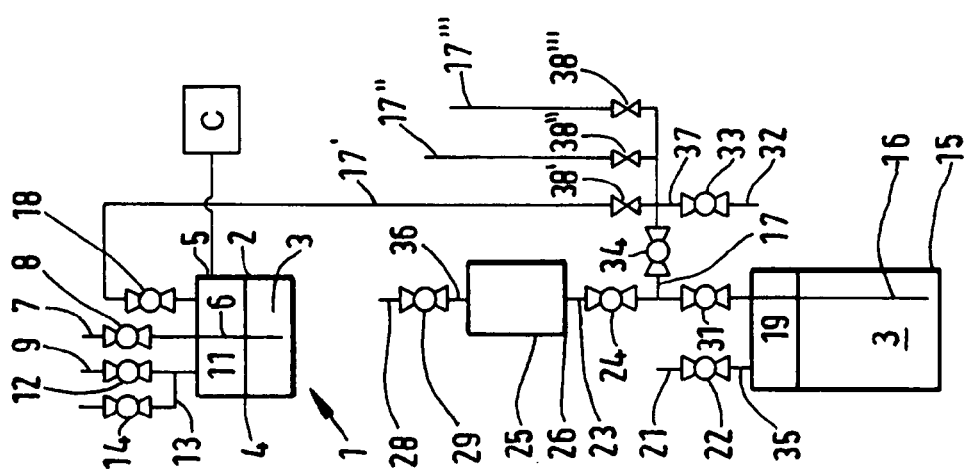

According to FIG. 1, a bubbler 1 has a tank 2 which is filled with a liquid substance 3, and which in FIG. 1 has a minimum level 4, detected by a level sensor 5.

Immersed in the liquid substance 3 is an immersion tube 6, through which a carrier gas is conveyed into the liquid substance 3 by means of a carrier gas line 7 with a valve 8, for the evaporation of the liquid substance 3.

The evaporated liquid substance 3 is conveyed via a supply line 9 to a user, not shown, e.g. a CVD reactor. The supply line 9 connected to the gas chamber 11 of the bubbler 1 has a valve 12. Between the gas chamber 11 and the valve 12, a gas discharge line 13 with a valve 14 is connected to the supply line 9.

The liquid substance 3 for refilling the bubbler 1 is stored in a reservoir tank 15. Immersed in the liquid substance 3 in the reservoir tank 15 is an immersion tube 16, which is connected by a connection line 17 with the gas chamber 11 of the bubbler 1, with a filling valve 18 being fitted on the end of the connection line 17 facing the bubbler 1.

Connected to the gas chamber 19 of the reservoir tank 15 is an inert gas line 21 with a valve 22. The reservoir tank 15 can also be evacuated via the inert gas line 21.

On the end part of the connection line 17 facing the reservoir tank 15, an intermediate tank 25 is connected to the connection line 17 via a junction line 23 with a valve 24, with said intermediate tank having a significantly smaller volume than that of the reservoir tank 15. The junction line 23 is connected at the base 26 of the intermediate tank 25. An inert gas line 28 with a valve 29 is connected to the upper part of the intermediate tank 25.

Between the junction line 23 and the immersion tube 16, a further valve 31 is provided in the connection line 17. In addition, between the junction line 23 and the filling valve 18, an inert gas line 32 with valve 33 is connected to the connection line 17, again on the end part of the connection line 17 facing the reservoir tank 5. Another valve 34 is provided in the connection line 17 between the junction line 23 and the inert gas line 32.

Pressure controllers 35, 36, and 37, respectively, are provided in the inert gas line connected to the gas chamber 19 of the reservoir tank 15, in the inert gas line 28 connected to the intermediate tank 25, and in the inert gas line 32 connected to the connection line 17.

Figure 3:
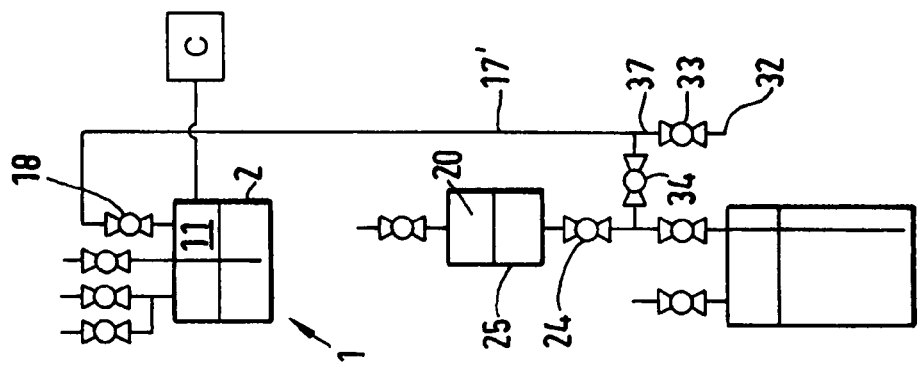
FIGS. 1 to 6 illustrate an embodiment of the apparatus in diagrammatic form according to the invention, with the individual steps for refilling the bubbler.
Figure 4:
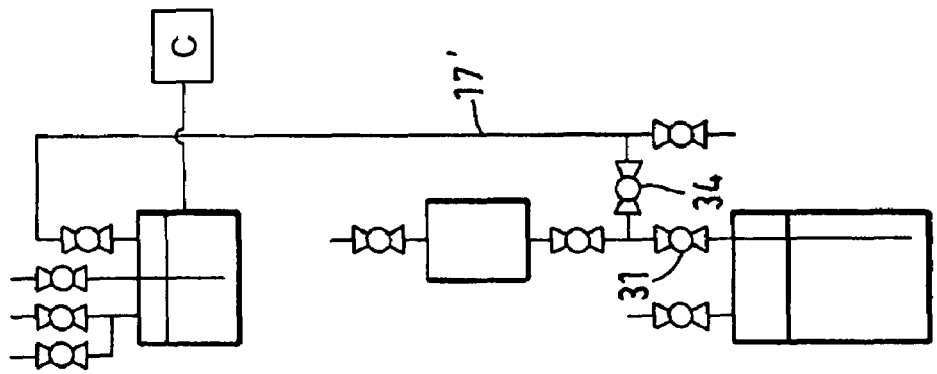

Through the connection of the junction line 23 to the base 26 of the intermediate tank 25, the liquid substance is fully evacuated from the intermediate tank 25 if a sufficiently high inert gas pressure is applied to the intermediate tank 25, as shown in FIGS. 3 and 4 and described in greater detail below.

Just as a vacuum can be connected to the inert gas line 21 connected to the gas chamber 19 of the reservoir tank 15, a similar vacuum connection can be made to the inert gas line 32 connected to the connection line 17. A vacuum can also be applied to the gas discharge line 13, in order to evacuate the connection line and the tank 2 of the bubbler 1.

The section of the connection line 17 between the inert gas line 32 and the filling valve 18 is in the form of the riser 17'. In a situation where several bubblers 1 for several users are to be filled from the reservoir tank 15 with the intermediate tank 25, the section of the connection line 17 from the immersion tube 16 to the inert gas line 32 forms the main section, from which individual lines 17', 17'', and 17''' then lead to the respective bubbler 1 in each case, as shown diagrammatically in FIG. 1. Lines 17', 17'', and 17''' each have valves 38', 38'', and 38''' between the inert gas line 32 and the respective bubbler 1, located in the end parts of individual lines 17', 17'', and 17''', facing the inert gas line 32.

The following example is provided, in combination with FIGS. 1 to 6, as further explanation of the invention; evacuated chambers in the tanks are shown in white, gas-filled chambers in gray, and chambers filled with liquid in a dark shade. It should also be noted that this example describes an apparatus with only one riser 17', i.e. without valve 38'.

The tank 2 has a volume of e.g. 1,000 cm$^3$. When the level of the liquid substance 3 in the bubbler 1 according to FIG. 1 falls to the minimum level 4 of e.g. 500 cm$^3$, the level sensor 5 actuates the control device C, which, in order to refill the bubbler 1 with the liquid substance 3, actuates valves 8, 12, 14, 18, 22, 24, 29, 31, 33, and 34 as follows (connections not shown for clarity):

1st Step (FIG. 1)

Valves 8, 12, 22, 24, 29, 31, 33, and 34 are closed and valves 14 and 18 opened, in order to evacuate the tank 2 of bubbler 1 via the gas discharge line 13 and the section 17' of connection line 17 between the inert gas line 32 and the tank 2. The intermediate tank 25, which has a volume of e.g. 1,000 cm$^3$, is empty, i.e. it does not contain any liquid substance 3. Valve 29 is opened, and the intermediate tank 25 fills with inert gas until the pressure controller 36 displays a predefined pressure P1, of e.g. 200,000 Pa, in the intermediate tank 25. Valve 29 is then closed.

Figure 2:
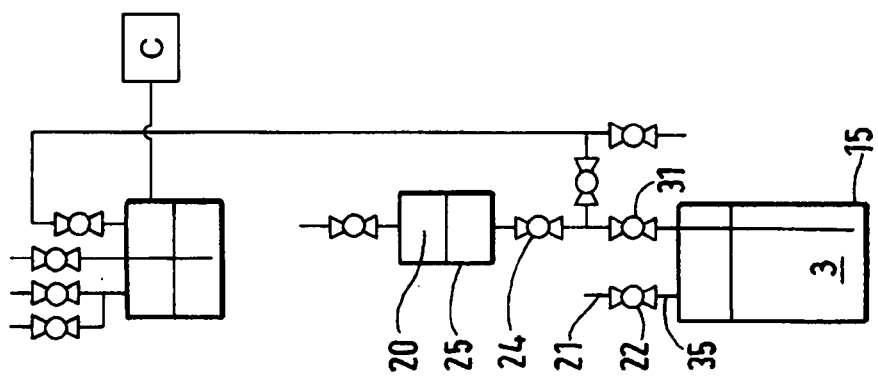

2nd Step (FIG. 2)

Valve 22 is opened, and inert gas is conveyed via the inert gas line 21 to the evacuated gas chamber 19 in the reservoir tank 15 until the pressure controller 35 displays a predefined pressure P2, of e.g. 400,000 Pa, in the reservoir tank 15.

3rd Step (FIG. 2)

Valves 24 and 31 are opened, in order to connect the reservoir tank 15 with the intermediate tank 25. Liquid substance 3 then flows from the reservoir tank 15 into the intermediate tank 25, until the pressure in the gas chamber 20 of the intermediate tank is P2, i.e. 400,000 Pa. In accordance with the equation P×V=const., at that time the intermediate tank 25 is filled with 500 cm$^3$ of the liquid substance 3.

4th Step (FIG. 2)

Valves 24 and 31 are closed, thereby severing the connection between the reservoir tank 15 and the intermediate tank 25. The pressure in the gas chamber 19 of the reservoir tank 15 is reduced via valve 22, and valve 22 is then closed. This concludes the phase of the transfer of exactly 500 ml of the liquid substance 3 from the reservoir tank 15 into the intermediate tank 25.

5th Step (FIG. 3)

Valves 18 and 33 are opened in order to fill the section 17' of the connection line 17 between the inert gas line 32 and the bubbler 1, and tank 2 of bubbler 1, with inert gas, until the pressure controller 37 displays a predefined pressure P3 of e.g. 50,000 Pa. Valve 33 is then closed.

6th Step (FIG. 4)

The volume of the gas chamber 20 in the intermediate tank 25 is 500 cm$^3$, at a pressure of 400,000 Pa.

The volume of the gas chamber in the riser section 17' of the connection line 17 between the inert gas line 32 and the bubbler 1 is 250 cm$^3$, and the volume of the gas chamber 11 of the tank 2 of the bubbler 1 is 500 cm$^3$, i.e. the total volume of the riser 17' and the gas chamber 11 is 750 cm$^3$, at a pressure of 50,000 Pa.

Valves 24 and 34 are then opened. This means that 500 cm$^3$ of liquid substance 3 is transferred into the riser 17' and the bubbler 1, 250 cm$^3$ into the riser 17', and 250 cm$^3$ into the bubbler 1. The maximum level 38 in the bubbler 1 is then reached. Pressure equilibrium is reached if the emptied intermediate tank 25 with a gas chamber 20 of 1,000 cm$^3$ is 200,000 Pa, and the pressure in the gas chamber 11 of tank 2 is 200,000 Pa minus the hydrostatic pressure of the riser 17', which is dependent on the height of the riser 17' and the density of the liquid substance 3; the hydrostatic pressure with trimethyl aluminum as the liquid substance 3 and riser 17' height of 7 m, for example, is 50,000 Pa.

Figure 5:
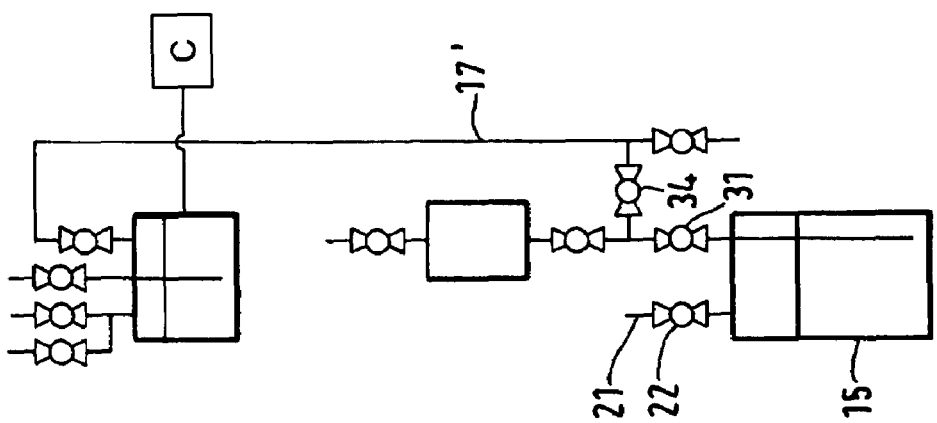

7th Step (FIG. 5)

Valve 22 is opened and the reservoir tank 15 is evacuated via the inert gas line 21 to the vapor pressure of the liquid substance 3, which for trimethyl aluminum, for example, is 1.036 Pa. The valve 22 is then closed.

Figure 6:
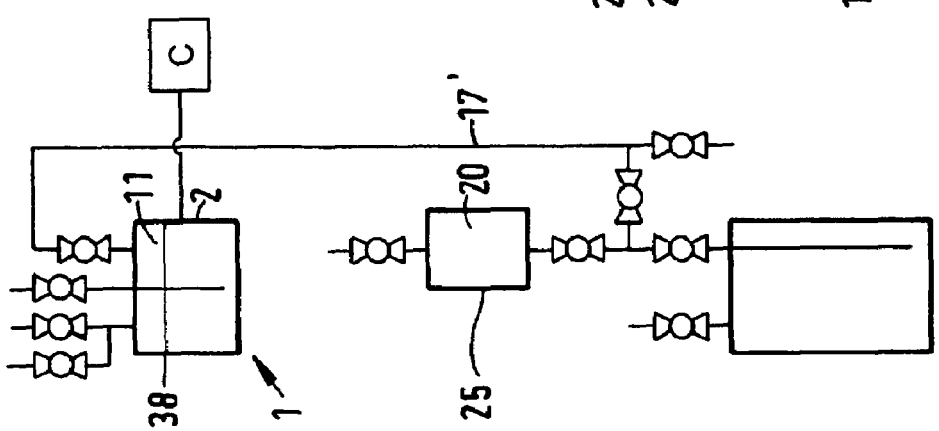

8th Step (FIG. 6)

Valves 31 and 34 are opened, as a result of which the liquid substance contained in the riser 17' (250 cm$^3$) is sucked back into the reservoir tank 15. Valves 31 and 34 are then closed.

Whereas steps 1 to 4 transfer the liquid substance 3 from the reservoir tank 15 into the intermediate tank 25, and steps 5 and 6 transfer the liquid substance 3 from the intermediate tank 25 into the bubbler 1, the purpose of steps 7 and 8 is to empty the connection line 17 after completion of the refilling process.

Thus, with the apparatus according to the invention, there are no measurements to be captured. Nor is there any process signal to be obeyed for the termination of the refilling cycle.

Furthermore, with the apparatus according to the invention, the duration of a refilling cycle is short, e.g. in the above example the cycle duration is only approx. 1 minute.

The invention claimed is:

1. Process for the refilling of at least one bubbler by providing an apparatus with a tank, which contains a liquid substance, and into which a carrier gas is conveyed via a carrier gas line, in order to evaporate the liquid substance, and convey it to a user via a supply line, with the following:

a reservoir tank, filled with the liquid substance, projecting into which is an immersion tube, which is connected via a connection line with the bubbler, an inert gas line, connected to the gas chamber of the reservoir tank, with an inert gas line valve, a filling valve in the connection line for filling the liquid substance into the bubbler, a supply line valve, a carrier gas line valve, level sensor in the bubbler, a control device to operate said valves, actuated by the level sensor when a minimum level is reached, for the refilling of the bubbler, an intermediate tank with a smaller volume than the reservoir tank, a second inert gas line with a second inert gas line valve connected to the intermediate tank, a junction line with a junction line valve from the intermediate tank to the connection line, a first connection line valve in the connection line between the immersion tube and the junction line, a third inert gas line with a third inert gas line valve connected between the junction line and the filling valve to the connection line, and a second connection line valve in the connection line between the junction line and the third inert gas line connected to the connection line; and wherein after a minimum level has been reached, the level sensor actuates the control device to perform the following steps:

(1.) following the closure of the carrier gas line valve and of the supply line valve and evacuation of the bubbler, a first predefined pressure is set in the empty intermediate tank via the inert gas line connected thereto, (2.) via the inert gas line connected thereto, a second predefined pressure is set in the reservoir tank, that pressure being higher than the first predefined pressure set in step (1.) in the intermediate tank, (3.) the reservoir tank is then connected with the intermediate tank in order to transfer into the intermediate tank a quantity of the liquid substance corresponding to the pressure difference between the second predefined pressure in the reservoir tank and the first predefined pressure in the intermediate tank, (4.) the connection between the reservoir tank and the intermediate tank is then severed, (5.) via the inert gas line connected to the connection line, a third pressure is set in the section of the connection line between the junction line of the intermediate tank and the bubbler, and in the bubbler, that pressure being lower than the pressure reached in step (3.) in the intermediate tank, (6.) the intermediate tank and the bubbler are then connected with one another, in order to transfer the liquid substance contained in the intermediate tank into the section of the connection line between the junction line and the bubbler and into the bubbler.

2. Process according to claim 1, characterized in that following step (6.):

(7.) the reservoir tank is evacuated, and (8.) the liquid substance is sucked back in the connection line into the evacuated reservoir tank.

3. Process according to claim 1, characterized in that with the intermediate tank being placed lower than the bubbler, in step (5.) the transfer of the liquid substance from the intermediate tank into the connection line and the bubbler is completed when the pressure in the bubbler is the same as the second predefined pressure in the intermediate tank minus the hydrostatic pressure from the height difference between the bubbler and the intermediate tank.

* * * * *